United States Patent
Watabe et al.

(10) Patent No.: US 6,664,496 B2
(45) Date of Patent: Dec. 16, 2003

(54) PLASMA PROCESSING SYSTEM

(75) Inventors: Yoshimi Watabe, Kunitachi (JP); Shinya Hasegawa, Fuchu (JP); Yoichiro Numasawa, Machida (JP); Yukito Nakagawa, Tachikawa (JP)

(73) Assignee: Anelva Corporation, Fuchu (JP)

( * ) Notice: Subject to any disclaimer, the term of this patent is extended or adjusted under 35 U.S.C. 154(b) by 107 days.

(21) Appl. No.: 10/107,304

(22) Filed: Mar. 28, 2002

(65) Prior Publication Data

US 2002/0144980 A1 Oct. 10, 2002

(30) Foreign Application Priority Data

Apr. 5, 2001 (JP) ........................................ 2001-106941

(51) Int. Cl.[7] .......................... B23K 9/00; C23C 15/505
(52) U.S. Cl. .......................... 219/121.43; 219/121.47; 219/121.58; 156/345.46; 118/723 I
(58) Field of Search .................... 219/121.11, 121.36, 219/121.37, 121.39, 121.4, 121.43, 121.47, 121.54, 121.56, 121.58; 118/723 E, 723 I, 723 R, 723 VE; 156/345.46, 345.51

(56) References Cited

U.S. PATENT DOCUMENTS 6,197,151 B1 * 3/2001 Kaji et al. ............. 156/345.46

FOREIGN PATENT DOCUMENTS

| JP | 08031753 A | * | 2/1996 | ......... H01L/21/205 |
| JP | 10-237653 | | 9/1998 | |
| JP | 10-237657 | | 9/1998 | |

* cited by examiner

Primary Examiner—Tu Ba Hoang
(74) Attorney, Agent, or Firm—Oliff & Berridge, PLC (57) ABSTRACT

A plasma processing system is comprised of a reaction vessel in which are provided a parallel high frequency electrode and ground electrode. The ground electrode is fixed at a ground potential portion, that is, a flange, by a conductive support column. A connection portion from the ground electrode to the ground potential portion, for example, the portions other than the surface of the ground electrode and the surface of the support column etc. are covered by an insulator serving as a high frequency power propagator while the surface of the insulator is covered completely by a conductive member except at the portion for introducing the high frequency power. In this plasma processing system, it is possible to reliably prevent undesirable discharge from occurring at the rear surface of the ground electrode when processing a substrate mounted on the ground electrode to deposit a film using a high frequency power in the VHF band.

5 Claims, 5 Drawing Sheets

PLASMA PROCESSING SYSTEM

BACKGROUND OF THE INVENTION

1. Field of the Invention

The present invention relates to a plasma processing system, more particularly relates to a plasma processing system having a structure preventing the occurrence of undesirable discharge at a rear surface of a ground-side electrode when causing discharge by high frequency power in a chemical vapor deposition (CVD) chamber provided with a parallel plate electrode structure.

2. Description of the Related Art

A plasma film-deposition system having a parallel plate electrode structure comprised of two electrodes deposits a film on a substrate by placing the substrate on one of the two electrodes and generating plasma between the two electrodes. Since the one electrode functions as a substrate holder and is connected to a chamber held at the ground potential, it is held electrically at the ground potential. This electrode is called the "ground electrode". The other electrode is supplied with a high frequency power from a high frequency power source and is called a "high frequency electrode". A main discharge is generated in the space between the electrodes due to the high frequency power supplied to the high frequency electrode to generate plasma.

As references disclosing the prior art relating to the plasma processing system according to the present invention, Japanese Unexamined Patent Publication (Kokai) No. 10-237653 and Japanese Unexamined Patent Publication (Kokai) No. 10-237657 may be mentioned.

Japanese Unexamined Patent Publication (Kokai) No. 10-237653 discloses an invention preventing abnormal discharge in a vacuum processing system. The invention provides a vacuum processing system such as a plasma CVD system, which has the structure for covering the portion of a susceptor in the substrate holding and elevating members exposed from the substrate holding member by an insulating member. The susceptor mounts the substrate to be processed. The structure prevents the abnormal discharge between a substrate elevator member of the susceptor and a vacuum processing chamber. The abnormal discharge occurs when a high frequency voltage is applied to the susceptor.

Japanese Unexamined Patent Publication (Kokai) No. 10-237657 discloses an invention relating to a plasma processing system free from contamination or corrosion of a discharge-preventing plate. In this invention, there is provided a susceptor mounting a substrate and supplied with a high frequency voltage. The susceptor is arranged in a state with a discharge-preventing plate electrically insulated from a susceptor body. The discharge-preventing plate is arranged to be close to the surroundings of the susceptor body. It has a mechanism for passing a gas in the clearance between the susceptor body and the discharge-preventing plate. The discharge-preventing plate arranged in proximity to the susceptor body prevents the discharge which easily occurred between the susceptor and chamber upon the application of voltage to the susceptor because of a rise in the discharge generating voltage along with the Paschen's law. There was however the problem that reaction products or corrosive gases would enter between the susceptor body and discharge preventing plate and therefore cause contamination or corrosion of the discharge-preventing plate. The above prior art solves this problem.

In a conventional plasma film-deposition system having a parallel plate electrode structure for depositing a film on a substrate, often a high frequency power, for example, a power of a high frequency of the VHF band (for example, 60 MHz) has been applied to the high frequency electrode. This was because high quality film-deposition characteristics were sought in the film deposited on the substrate. If the frequency of the high frequency power becomes higher, the input impedance (impedance as seen from opening) of the high frequency circuit comprised in the space between the ground electrode and the chamber becomes higher. As a result, the potential difference between the ground electrode and the chamber becomes greater and an undesirable discharge occurs at the rear surface of the substrate holder, that is, the ground electrode. This discharge has an effect on the main discharge occurring between the two electrodes and causes problems in the reproducibility and film-deposition characteristics in the film deposition on the substrate.

Further, along with an enlargement in size of substrates in recent years, it has become necessary to increase the high frequency current supplied to maintain a constant current density on the substrate. If the high frequency current is increased, undesirable discharge occurs due to the same action as above and the same problems as above occur.

If considering the inventions disclosed in the above known references from the viewpoint of solving the problems in the conventional plasma film-deposition system having the parallel plate electrode structure, each invention deals with problems relating to undesirable discharge occurring at the high frequency electrode. Further, they does not relate to undesirable discharge relating to the path through which the high frequency power is propagated from the ground electrode to the chamber of the ground potential at the rear surface of the ground electrode. In particular, as explained above, it is difficult for the plasma processing systems disclosed in the above references to prevent undesirable discharge at the rear surface of the ground electrode. The undesirable discharge occurs in relation to the higher level of discharge frequencies. The higher discharge frequency follows the enlargement in the size of the substrates or demands for high quality film characteristics. That is, it is not possible to completely prevent undesirable discharge from occurring at the rear surface of the ground electrode by the configurations disclosed in the above references.

SUMMARY OF THE INVENTION

An object of the present invention is to provide a plasma processing system designed to reliably prevent undesirable discharge from occurring at the rear surface of a ground electrode when performing processing to deposit a film on a substrate mounted on the ground electrode using a high frequency power of a frequency in the VHF band.

The plasma processing system according to the present invention is configured as follows so as to achieve the above object.

The plasma processing system of the present invention is comprised of a chamber in which are provided a high frequency power source side electrode (called a "high frequency electrode") and a ground side electrode (called a "ground electrode"). Normally, the high frequency electrode is provided at a ceiling of the chamber, while the ground electrode is provided at the bottom of the chamber. The high frequency electrode and the ground electrode are arranged in parallel. A column made by a conductive member supports the ground electrode. The support column is affixed to part of the chamber held at the ground potential. The chamber corresponds to the ground potential portion. Further, the support column is actually structured to move up and down by an elevator mechanism. The ground electrode also moves up and down simultaneously due to the up and down motion of the support column. The substrate to be processed is mounted on the ground electrode. The ground electrode therefore has the function of a substrate holder. The substrate is a large area substrate having a relatively large diameter. Corresponding to this, the high frequency electrode is supplied with a relatively large high frequency power in order to maintain the power density on the substrate at a predetermined constant value. When causing discharge between the high frequency electrode and the ground electrode, the ground electrode on which the substrate is mounted is made to rise by the elevator mechanism. The movement by the elevator mechanism narrows the space between the two electrodes. The high frequency power is supplied from the high frequency power source under conditions of the required reduced pressure, discharge gas, and feedstock gas. In this way, discharge is caused between the two electrodes by the high frequency power supplied from the high frequency power source and the thus produced plasma is used to treat or process the substrate mounted on the ground side electrode. The characteristic feature of the configuration is as follows. The surface of the connection part from the ground electrode to the ground potential portions (portions other than surface of the ground electrode, support column, etc.) is covered by a high frequency power propagating medium. The surface of the high frequency power-propagating medium is covered completely by a conductor except the portion for introducing the high frequency power.

If main discharge is caused by supplying high frequency power to the space between the high frequency electrode and the ground electrode, the high frequency power propagates from the region where the main discharge occurs at the front surface of the ground electrode toward the ground potential portions. In the past, this caused undesirable discharge at the rear surface side of the ground electrode. According to the above configuration of the present invention, however, the high frequency power heading toward the ground potential portions propagates through the high frequency power-propagating medium. As a result, it is possible to reliably prevent the occurrence of undesirable discharge at the rear surface side or periphery of the ground electrode.

In the above configuration, preferably the high frequency power propagating medium covers the entire surface of the connection portion including the rear surface of the ground electrode. According to this configuration, the rear surface of the ground electrode and the entire surface of the connection portion are covered by the high frequency power-propagating medium. This is suitable for a small-sized film-deposition chamber.

In the above configuration, preferably the high frequency power propagating medium covers the entire surface of the connection portion including the side surfaces and rear surface of the ground electrode. According to this configuration, the side surfaces and rear surface of the ground electrode and the entire surface of the connection portion are covered by the high frequency power propagating medium and the structure on the ground electrode side becomes large, but this is suited for a large-sized film-deposition chamber. Further, since the surfaces are completely covered, this structure is desirable for when completely preventing discharge.

In the above configurations, the high frequency power propagating medium is preferably one of an insulator, a low pressure gas, and a composite of an insulator and a low pressure gas. In the case of a low-pressure gas, a space having a predetermined narrow width is formed, and the low-pressure gas enters into and fills that space. Even such a low-pressure gas acts as a high frequency power-propagating medium. Further, alumina is preferable as the above insulator.

BRIEF DESCRIPTION OF THE DRAWINGS

The above-mentioned objects and features of the present invention will become clearer from the following description of the preferred embodiments given with reference to the attached drawings, wherein.

DESCRIPTION OF THE PREFERRED EMBODIMENTS

Next, preferred embodiments of the present invention will be explained with reference to the attached drawings. The configurations, shapes, and relative arrangement of the parts explained in the embodiments are only shown schematically to an extent enabling understanding of the present invention. Therefore, the present invention is not limited to the embodiments explained below and can be modified in various ways within the scope of the technical concept expressed in the claims. Note that the plasma processing system explained in the following embodiments naturally is a concept including all systems for processing of a substrate utilizing plasma and includes various types of sputtering systems, plasma CVD systems, and other processing or treatment systems utilizing plasma.

Figure 1:
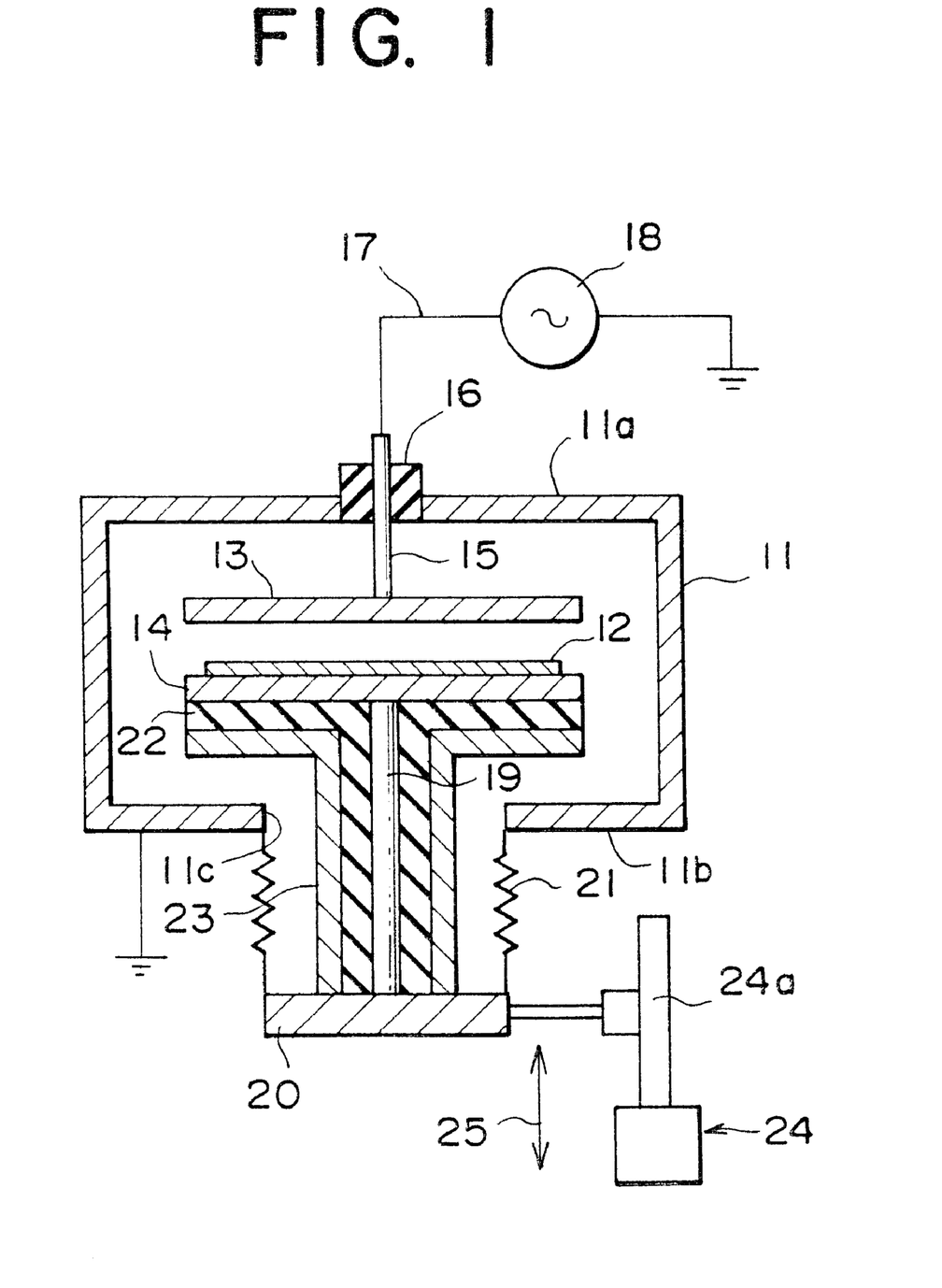
FIG. 1 is a longitudinal sectional view of main parts of a plasma processing system according to a first embodiment of the present invention.

FIG. 1 shows a plasma processing system according to a first embodiment of the present invention. For example, a reaction vessel 11 forming a film-deposition chamber is, in the illustration, of a sealed structure and is set so that its inside is in a required vacuum state (reduced pressure state). The reaction vessel 11 is made by a metal material and has conductivity. The reaction vessel 11 in actuality is additionally provided with a port for loading and unloading a substrate 12 to be processed, an evacuation port, an evacuation unit, and other parts of a gas introduction mechanism for introducing a discharge gas for causing discharge. In FIG. 1, however, since well-known configurations are used as those components, their illustrations will be omitted for convenience in the explanation.

Inside the reaction vessel 11, a high frequency electrode 13 is arranged at the top side, while a ground electrode 14 is arranged at the bottom side. The high frequency electrode 13 and the ground electrode 14 are typically both disk-shaped conductive plates and are arranged facing each other in parallel across a desirable space. The space between the high frequency electrode 13 and the ground electrode 14 may be freely changed. A conductive support rod 15 supporting the high frequency electrode 13 is fixed to a ceiling 11a of the reaction vessel 11 through an insulator 16. The support rod 15 of the high frequency electrode 13 is led to the outside of the reaction vessel 11. The outside end of the support rod 15 is connected to a cable 17 for transmitting a high frequency power. The support rod 15 is connected to a high frequency power source 18 through the cable 17. The high frequency power source 18 outputs a high frequency power of the VHF band. The high frequency power output from the high frequency power source 18 is supplied to the high frequency electrode 13 through the cable 17 and the support rod 15. The high frequency power supplied to the high frequency electrode 13 becomes the energy of the main discharge which can be caused in the space between the high frequency electrode 13 and the ground electrode 14.

The ground electrode 14 is supported by a rod-shaped conductive support column 19 and is affixed to a conductive flange 20. The flange 20 is arranged corresponding to an opening 11c formed in a bottom 11b of the reaction vessel 11. Between the rim forming the opening 11c and the periphery of the flange 20 is provided a cylindrically shaped conductive bellows 21. The bellows 21 connects the rim of the opening 11c and the periphery of the flange 20 to hold an inner space in an air-tight state.

As shown in FIG. 1, the reaction vessel 11 is grounded and is held at the ground potential. The ground electrode 14 is electrically connected to the reaction vessel 11 through the support column 19, flange 20, and bellows 21 and so it is held at the ground potential. Therefore, in this sense, the lower electrode 14 out of the two facing electrodes 13 and 14 in the reaction vessel 11 is called the "ground electrode".

The flange 20 forming part of the reaction vessel 11 forms a ground potential portion as explained above. The support column 19 is at the rear side of the ground electrode 14 and connects the ground electrode 14 and flange (ground potential portion) 20.

The above-mentioned substrate 12 is mounted on the disk-shaped ground electrode 14. The ground electrode 14 also has the function of a substrate holder. The substrate 12 may be of any size, but here a large area substrate having a relatively large diameter is processed.

At the rear side of the ground electrode 14, there is an insulator 22 covering the rear surface of the ground electrode 14 and the entire surface of the support column 19. As the insulator 22, preferably alumina is used. The thickness of the insulator 22 may be freely set in accordance with the objective. Further, the surface of the insulator 22 is provided with a conductive member 23 except for the portion where the high frequency power enters at the outside position (portion introducing high frequency power, in the example shown in FIG. 1, the side portion). The conductive member 23 is a conductor covering the outside surface of the insulator 22.

Due to the above-mentioned structure, the insulator 22 acts as a high frequency power propagating medium. That is, the insulator 22 formed between the conductive member 23 and each of the ground electrode 14 and support column 19, which are made of conductors, has the function of propagating the high frequency power from the high frequency electrode 13 to the flange 20. The high frequency power from the high frequency electrode 13 creates an electromagnetic field in the insulator 22 and is propagated from the rear surface side of the ground electrode 14 to the flange 20. Therefore, the high frequency power propagated through the insulator 22 can reduce the rate of creation of an electromagnetic field between the conductive member 23 and the reaction vessel 11.

The flange 20 is attached to an elevator mechanism 24. The elevator mechanism 24 enables the flange 20 to move up and down as shown by the arrows 25 along a guide part 24a. The ground electrode 14 and the related structural parts also move up and down along with the up and down motion of the flange 20. The bellows 21 can structurally expand and contract in a state holding the above air-tightness. Due to this structure, it is possible to make the ground electrode 14 move up and down and thereby possible to change the height position of the substrate 12 and change the space between the high frequency electrode 13 and the ground electrode 14. When causing the main discharge in the space between the high frequency electrode 13 and the ground electrode 14 to deposit a film by CVD on the substrate 12 on the ground electrode 14, the space between the high frequency electrode 13 and the ground electrode 14 is narrowed.

Next, the principle of generation of the characteristic action of the plasma processing system having the above structure will be explained based on FIG. 2.

Figure 2:
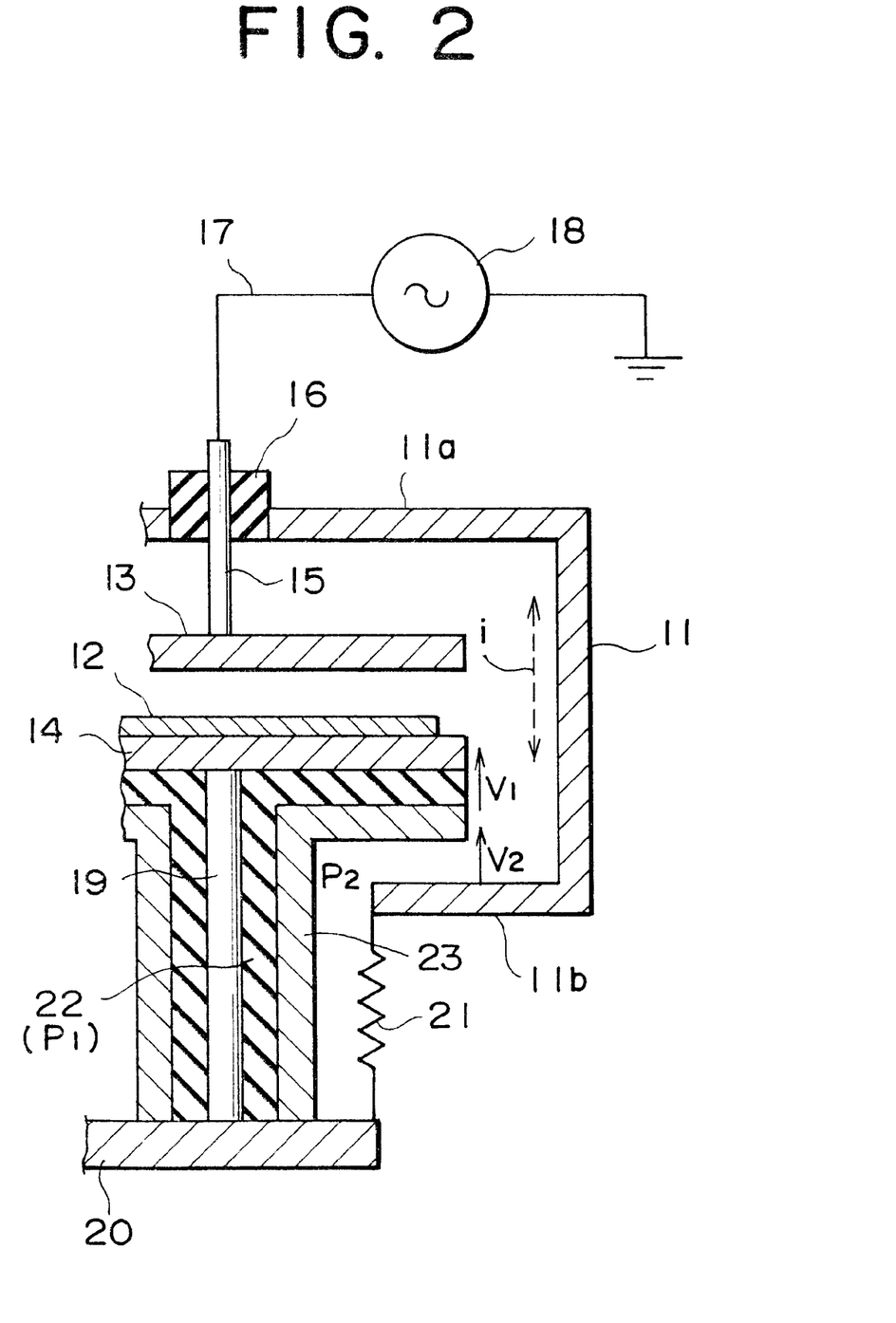
FIG. 2 is a view for explaining the principle of the plasma processing system according to the present invention.

FIG. 2 is a sectional view showing the portion of the right half of FIG. 1 enlarged. When high frequency (for example 60 MHz) power is supplied from the high frequency power source 18 to the high frequency electrode 13, a high frequency current (i) flows as shown by the broken lines along the conductive wall of the grounded reaction vessel 11. The high frequency current i is determined by the load impedance for the high frequency power source 18. The path of the high frequency current i is formed by the cable 17, the support rod 15, high frequency electrode 13, ground electrode 14, support column 19, inside of the conductive member 23, outside of the conductive member 23, flange 20, bellows 21, and reaction vessel 11. In the path through which the high frequency current i flows, the region ($P_1$) which the illustrated insulator 22 occupies and the space ($P_2$) formed at the outside of the conductor member 23 can be treated as an RF circuit with the front end short-circuited. Therefore, the input impedance of the region $P_1$ (impedance seen from the opened end) is designated as $Z_1$, the input impedance of the space $P_2$ (impedance seen from opening) as $Z_2$, the voltage occurring at the region $P_1$ and the voltage occurring at the region $P_2$ due to the high frequency current i as $V_1$ and $V_2$, respectively. At this time, since the region $P_1$ is filled by the insulator 23 as explained earlier, the relationship $Z_1 >> Z_2$ stands. Therefore, the voltage $V_1$ and the voltage $V_2$ may also be made $V_1 >> V_2$.

Figure 3:
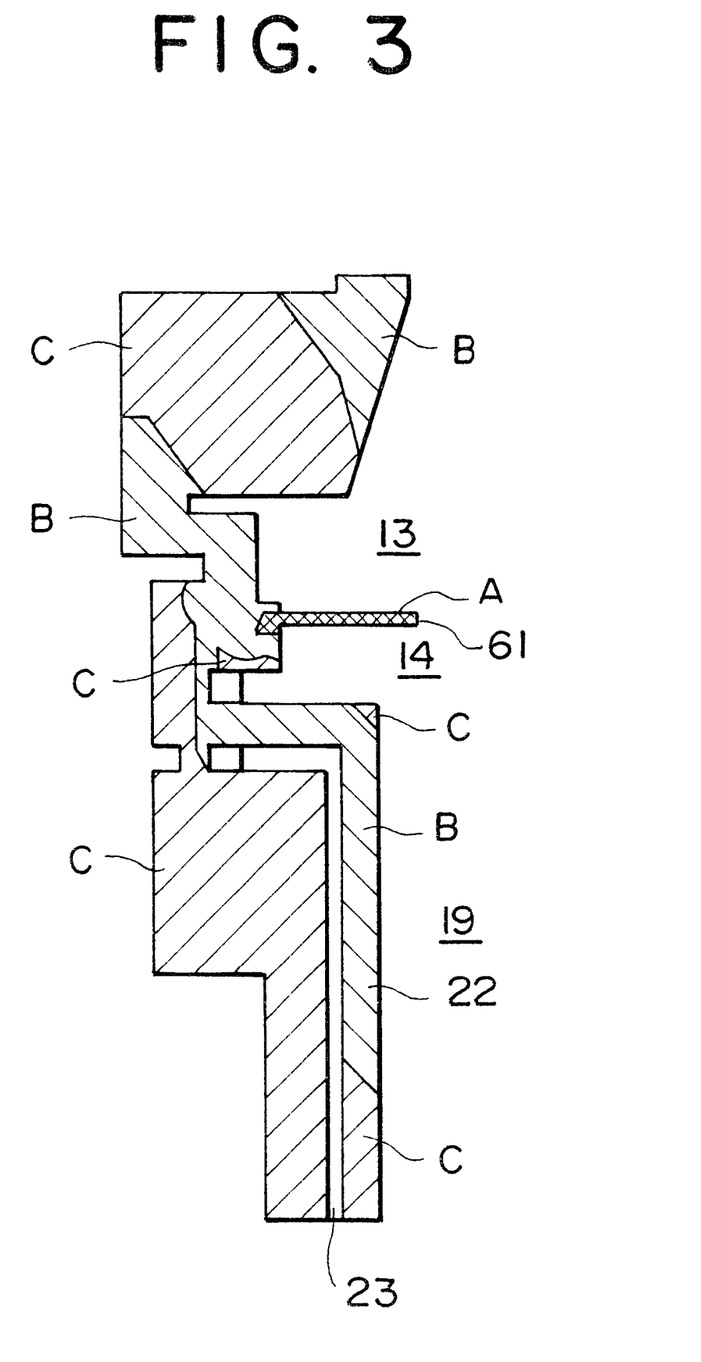
FIG. 3 is a view of a simulation of the electromagnetic field distribution in the plasma processing system shown in FIG. 1.

FIG. 3 is a simulation showing the distribution of intensity of the electromagnetic field occurring in other regions in the actual configuration of a plasma processing system according to the first embodiment explained in FIG. 1 when raising the ground electrode 14 to the upper limit position causing main discharge in the space 61 between the high frequency electrode 13 and the ground electrode 14 to deposit a film on the substrate 12 by CVD. FIG. 3 shows only the left side portion of FIG. 1. The results of the simulation of the distribution of intensity of the electromagnetic field of FIG. 3 will be explained based on the principle explained in FIG. 2.

As shown schematically in FIG. 3, the highest electromagnetic field (region A) is generated and the main discharge effectively occurs in the space 61. In the other regions, the electromagnetic field intensity becomes high in limited regions where the high frequency power propagates in the side spaces of the ground electrode 14, that is, the insulator 22 of the high frequency power propagator (region B). Further, the electromagnetic field becomes weak in the space between the conductor member 23 and reaction vessel 11 and the space above the high frequency electrode 13 (region C). The weakness of the electromagnetic field is one which enables the occurrence of undesirable discharge to be sufficiently prevented. In this way, the high frequency power supplied from the high frequency electrode 13 causes the main discharge at the space 61 and the remaining part of the power is propagated through the insulators 52 to 55 to the ground potential portions. When the region B is a dielectric, no discharge occurs at the region B because there is no gas. Even when the region B is a low pressure gas, since the width of the region B is smaller than the wide of the discharge as found from the Paschen's law, no discharge occurs at the region B.

Figure 4:
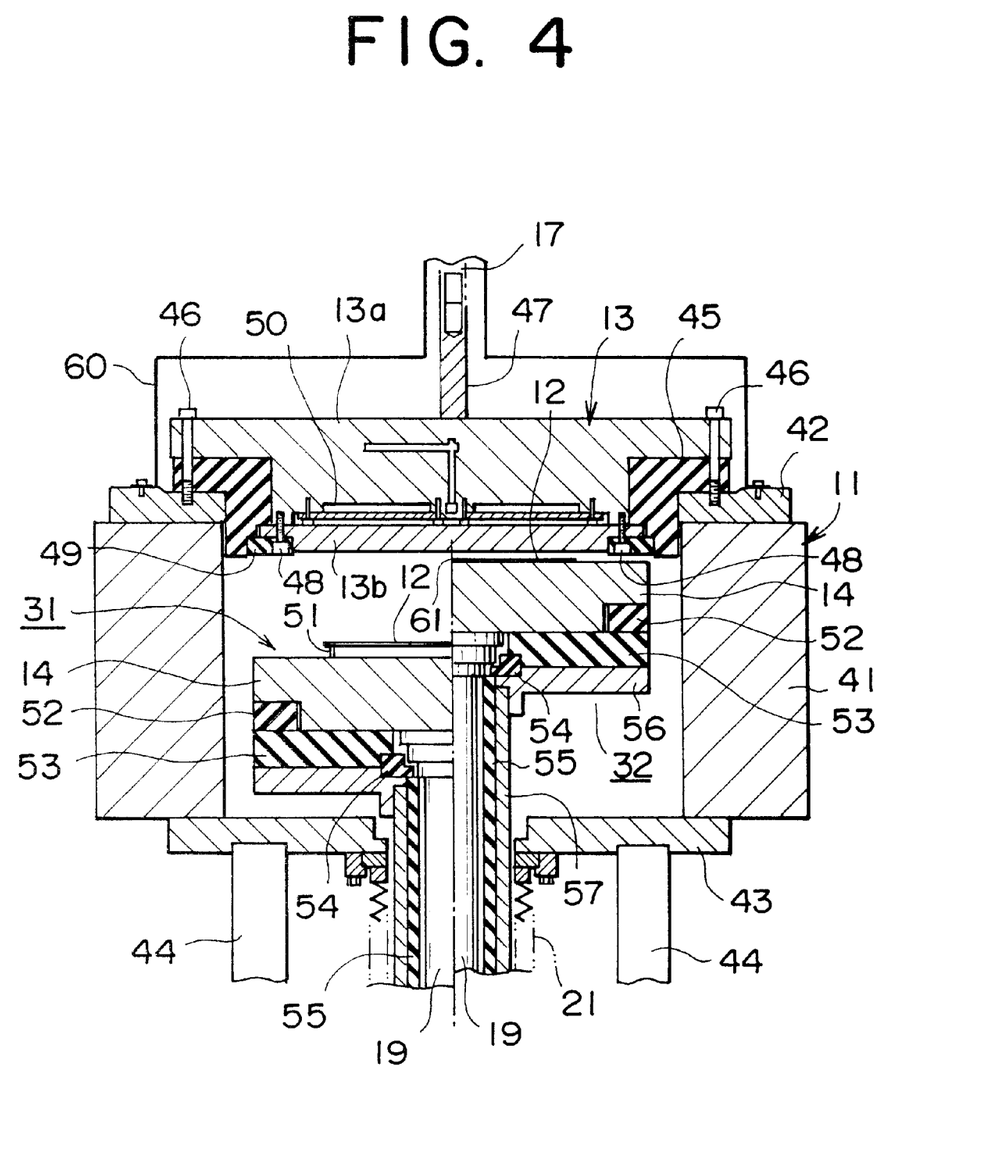
FIG. 4 is a longitudinal sectional view of main parts of a specific example of a plasma processing system according to the first embodiment.

Next, FIG. 4 shows an actual example of the configuration of the first embodiment. In FIG. 4, elements substantially the same as the elements explained in FIG. 1 are assigned the same reference numerals. In this example, from the viewpoint of simplification of the illustration, the portion of the substrate holder including the ground electrode 14 is shown divided into two portions. A left half 31 showing the state at the lower limit position due to descent and a right half 32 showing the state at the upper limit position due to ascent.

The reaction vessel 11 is comprised of a cylindrically shaped side member 41, a ceiling member 42, and a bottom member 43. The reaction vessel 11 is grounded and therefore is held at the ground potential. The bottom member 43 is supported by a plurality of support columns 44 supporting the reaction vessel 11 as a whole. The ceiling member 42 is formed with an opening at its center. The opening has attached through it a high frequency electrode 13 by bolts through a ring-shaped insulator 45. The high frequency electrode 13 is comprised of an upper member 13a and a lower member 13b. A connecting terminal 47 provided at a center part of the top surface of the upper member 13a is connected to a high frequency power transmission cable 17. The lower member 13b is fixed to the bottom surface of the upper member 13a by screws 48. The screws 48 simultaneously attach the ring-shaped insulator 49 to the bottom periphery of the lower member 13b of the high frequency electrode 13. A gas channel 50 for carrying a process gas is formed in the space between the upper member 13a and lower member 13b and the inside of the upper member 13a.

The substrate 12 is mounted on the ground electrode 14. In the view of the left half 31, the substrate 12 is supported by push rods 51 and is in a state floating up from the mounting surface of the ground electrode 14. In the view of the right half 32, the ground electrode 14 rises and is located at the upper position, so the substrate 12 is in a state mounted on the ground electrode 14.

At the rear surface side of the ground electrode 14, a ring-shaped first insulator 52, a donut-shaped second insulator 53, a ring-shaped third insulator 54, and a cylindrically shaped fourth insulator 55 are arranged. The first to fourth insulators 52 to 55 cover the rear surface of the ground electrode 14 and the entire surface of the support column 19. Further, the surfaces of the second to fourth insulators 53 to 55 are covered by two conductive members 56 and 57. The insulators 52 to 55 are covered by the conductive members 56 and 57 over their entire surfaces exposed in the reaction vessel 11 except for the surfaces of the side peripheries of the first and second insulators 52 and 53.

The portion of the ground electrode 14 relating to the support column 19 is extended to the region below the reaction vessel 11 through the opening formed at the center of the bottom member 43. These members, as explained above, are surrounded by the bellows 21 attached to the bottom surface of the bottom member 43. In FIG. 4, the flange 20 etc. are not shown, but their structure and the rest of the structures are substantially the same as the structures shown in FIG. 1.

In FIG. 4, while not illustrated, the above-mentioned elevator mechanism 24 is provided. Due to the elevator mechanism 24, as shown in FIG. 4, the ground electrode 14 and the related structural portions can move up and down between the lower limit position and the upper limit position. Further, a cover 60 is affixed to the top side of the reaction vessel 11.

In the structure shown in FIG. 4 as well, at the structural portions of the ground electrode 14 at the rear surface side, the outside surface of the connection portion (support column 19) up to the ground potential portions (flange portion), including the rear surface of the ground electrode 14, is entirely covered by the insulators 52 to 55. The portion of the insulators is in turn entirely covered by conductive members 56 and 57 except for the side portions. As a result, a similar action as explained in the first embodiment occurs and it is possible to prevent the occurrence of undesirable discharge.

Figure 5:
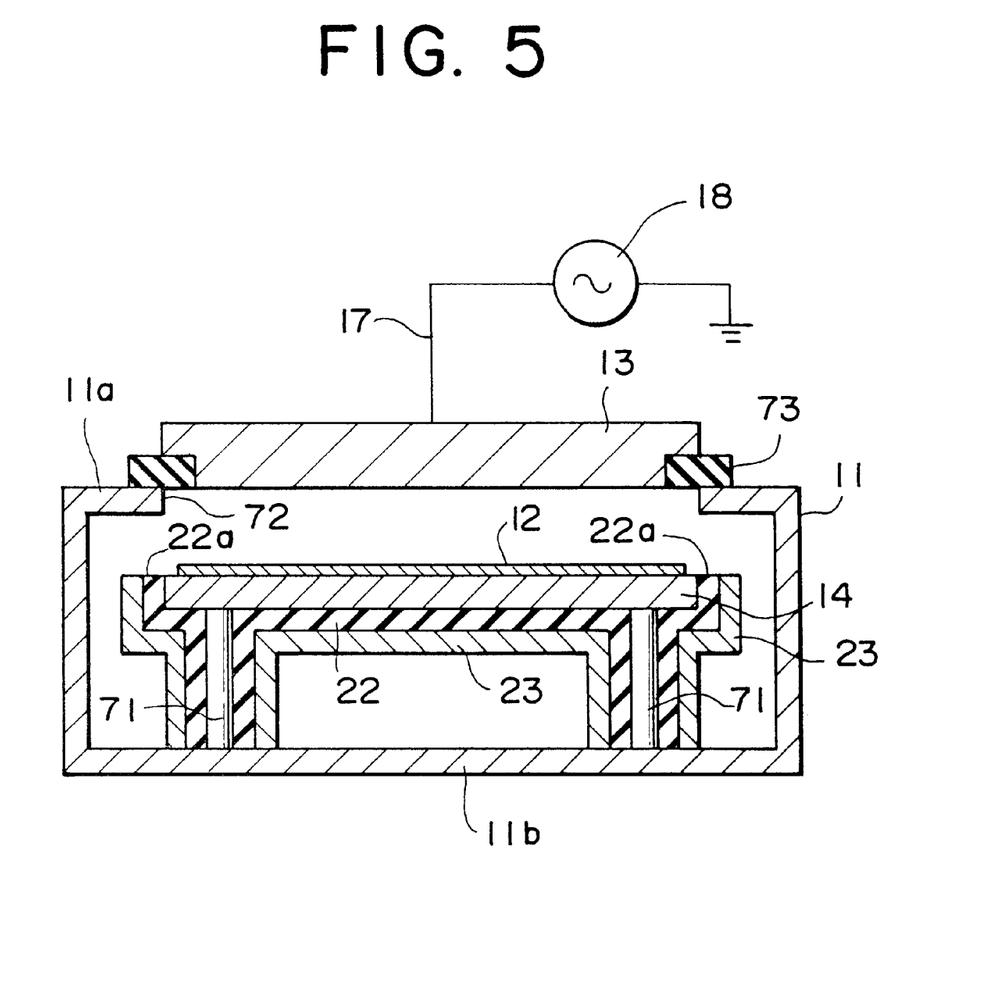
FIG. 5 is a longitudinal sectional view of main parts of a plasma processing system according to a second embodiment of the present invention.

A second embodiment of the plasma processing system according to the present invention will be explained next referring to FIG. 5. FIG. 5 is a conceptual view similar to FIG. 1. In FIG. 5, elements substantially the same as elements explained in the above embodiment are assigned the same reference numerals.

The reaction vessel shown in FIG. 5 is a large-sized reaction vessel with relatively large dimensions in the diametrical direction. The inside of the reaction vessel 11 is provided with the ground electrode 14 fixed to the floor 11b by a plurality of conductive legs 71. This ground electrode 14 functions as a substrate holder and has the substrate 12 mounted on it. The ceiling 11a of the reaction vessel 11 has attached to it a high frequency electrode 13 at its opening 72 through a ring-shaped insulator 73. The bottom surface of the high frequency electrode 13 faces the top surface of the ground electrode 14. The two are in a parallel positional relationship. The high frequency electrode 13 is connected through the cable 17 to the high frequency power source 18. The reaction vessel 11 is grounded and therefore at the ground potential. Therefore, the ground electrode 14 only naturally is also held at the ground potential.

An insulator 22 is provided so as to cover the side surfaces and the rear surface of the ground electrode 14 and the surfaces of the plurality of legs 71. Further, the surface of the insulator 22 is covered by a conductive member 23 except the ring-shaped surface portion 22a close to the surface of the ground electrode 14.

According to the configuration of the second embodiment, the surface of the insulator 22 is substantially completely covered. Due to this configuration of the present embodiment as well, the high frequency power is propagated to the ground potential portions using the insulator 22 as a high frequency power-propagating medium. Therefore, it is possible to completely prevent undesirable discharge liable to occur between the structural portions of the ground electrode 14 and the reaction vessel 11.

The electromagnetic field distribution in the insulator used as the high frequency power propagator is not affected by the main discharge between the high frequency electrode and the ground electrode. Accordingly, the impedance between the main discharge and the ground potential portion becomes extremely stable. Further, by using such a configuration, analysis of the electromagnetic field becomes easy and it becomes possible to design in advance a structure enabling effective input of the high frequency power to the space for the main discharge.

The system of the present embodiment was used for generating plasma. As the VHF, a 60 MHz frequency was used. The introduced gas was made $N_2$, the pressure 50 to 200 Pa, and the input power 0.1 to 3 kW. As a result, no generation of plasma was observed in the lower space below the lower electrode and stable plasma was generated in the space between the upper electrode and the lower electrode.

In the above embodiments, the explanation was given of the example of filling an insulator inside the space formed between the ground electrode and the conductive member for use as the high frequency power propagator at the rear side of the ground electrode, but the high frequency power propagator is not limited to an insulator. For example, it is also possible to form a space of a desirable length between the ground electrode and the conductive member and fill it with a low pressure gas so as to create the high frequency power propagator. Further, it is possible to form the high frequency power propagator by a composite of the insulator and low pressure gas.

The present invention exhibits the following effects: Since the connection portion from the ground electrode to the ground potential portions of the chamber is covered by a high frequency power propagating medium (insulator, etc.) and the surface of the high frequency power propagating medium is entirely covered by a conductor except for the portion for introducing the high frequency power, the electromagnetic field generated due to the current flowing through the connection portion occurs inside the high frequency power propagating medium. Therefore, when processing a large area substrate using high frequency power of a frequency in the VHF band, it is possible to reliably prevent undesirable discharge from occurring at the rear surface of the ground electrode.

The present disclosure relates to subject matter contained in Japanese Patent Application No. 2001-106941, filed on Apr. 5, 2001, the disclosure of which is expressly incorporated herein by reference in its entirety.

What is claimed is:

1. A plasma processing system having a high frequency power source side electrode and a ground side electrode, causing discharge between the two said electrodes by power resulting from a high frequency power supplied from a high frequency power source, and processing a substrate mounted on said ground side electrode by plasma produced as a result, wherein a surface of a connection portion from said ground side electrode to a ground potential portion is covered by a high frequency power propagating medium and a surface of said high frequency power propagating medium is covered entirely by a conductor except at a portion for introducing the high frequency power.

2. A plasma processing system as set forth in claim 1, wherein said high frequency power propagating medium covers the entire surface of said connection portion including the rear surface of said ground side electrode.

3. A plasma processing system as set forth in claim 1, wherein said high frequency power propagating medium covers the entire surface of said connection portion including the rear surface and side surfaces of said ground side electrode.

4. A plasma processing system as set forth in claim 1, wherein said high frequency power propagating medium is one of an insulator, a low pressure gas, and a composite of said insulator and said low pressure gas.

5. A plasma processing system as set forth in claim 4, wherein said insulator is alumina.

* * * * *